US008980736B2

(12) United States Patent
Kim

(10) Patent No.: US 8,980,736 B2
(45) Date of Patent: Mar. 17, 2015

(54) SEMICONDUCTOR DEVICES AND METHODS OF MANUFACTURING THE SAME

(71) Applicant: Samsung Electronics Co., Ltd., Suwon-Si, Gyeonggi-Do (KR)

(72) Inventor: Jong Un Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/189,178

(22) Filed: Feb. 25, 2014

(65) Prior Publication Data

US 2014/0179073 A1 Jun. 26, 2014

Related U.S. Application Data

(62) Division of application No. 13/760,597, filed on Feb. 6, 2013, now Pat. No. 8,686,485.

(30) Foreign Application Priority Data

Mar. 20, 2012 (KR) ........................ 10-2012-0028339

(51) Int. Cl.
*H01L 21/02* (2006.01)
*H01L 21/8234* (2006.01)
*H01L 27/108* (2006.01)
*H01L 27/06* (2006.01)

(52) U.S. Cl.
CPC .. *H01L 21/823487* (2013.01); *H01L 27/10876* (2013.01); *H01L 27/0629* (2013.01)
USPC .... 438/596; 438/635; 438/767; 257/E21.409; 257/E29.245; 257/E29.255

(58) Field of Classification Search
CPC .................. H01L 21/823487; H01L 27/0629; H01L 27/10811; H01L 27/10876; H01L 27/10823; H01L 27/10867; H01L 27/11578; H01L 29/66621
USPC .................................. 438/596–626, 636, 767
See application file for complete search history.

(56) References Cited

U.S. PATENT DOCUMENTS

| | | | |
|---|---|---|---|
| 6,638,823 B2 | 10/2003 | Cho et al. | |
| 7,071,048 B2 | 7/2006 | Son et al. | |
| 7,323,375 B2 | 1/2008 | Yoon et al. | |
| 7,425,491 B2 | 9/2008 | Forbes | |
| 7,906,814 B2 | 3/2011 | Lee | |
| 8,178,862 B2 * | 5/2012 | Colinge | 257/9 |
| 8,395,942 B2 * | 3/2013 | Samachisa et al. | 365/185.17 |
| 8,686,485 B2 * | 4/2014 | Kim | 257/296 |
| 2002/0140032 A1 | 10/2002 | Cho et al. | |
| 2005/0093082 A1 | 5/2005 | Son et al. | |
| 2005/0176197 A1 * | 8/2005 | Weis et al. | 438/243 |

(Continued)

FOREIGN PATENT DOCUMENTS

JP 2008-205168 A 9/2008
KR 2010-0129011 A 12/2010

*Primary Examiner* — Michael Lebentritt
(74) *Attorney, Agent, or Firm* — Harness, Dickey & Pierce, PLC

(57) ABSTRACT

A method of manufacturing a semiconductor device may include: forming active patterns of pillar-shapes upward protruding from a substrate, the active patterns fully doped with dopants of one conductivity type; forming a gate electrode extending in one direction, the gate electrode overlapped with sidewalls of the active patterns; and forming a gate insulating layer between the gate electrode and the active patterns.

7 Claims, 19 Drawing Sheets

(56) References Cited

U.S. PATENT DOCUMENTS

| | | |
|---|---|---|
| 2005/0250285 A1 | 11/2005 | Yoon et al. |
| 2007/0057301 A1* | 3/2007 | Wang et al. .................. 257/296 |
| 2007/0232007 A1 | 10/2007 | Forbes |
| 2010/0270619 A1 | 10/2010 | Lee |
| 2011/0073925 A1 | 3/2011 | Park et al. |
| 2011/0133162 A1 | 6/2011 | Bangsaruntip et al. |
| 2013/0153990 A1* | 6/2013 | Lee et al. ...................... 257/329 |

* cited by examiner

SEMICONDUCTOR DEVICES AND METHODS OF MANUFACTURING THE SAME

CROSS-REFERENCE TO RELATED APPLICATION(S)

This application is a divisional of U.S. patent application Ser. No. 13/760,597, filed on Feb. 6, 2013 (published as U.S. Patent Application Publication No. 2013/0248956 A1); which claims priority from Korean Patent Application No. 10-2012-0028339, filed on Mar. 20, 2012, in the Korean Intellectual Property Office (KIPO), the entire contents of both of which are incorporated herein by reference.

BACKGROUND

1. Technical Field

Example embodiments of the inventive concept may relate to semiconductor devices and/or methods of forming the same. Example embodiments of the inventive concept also may relate to semiconductor devices including vertical channel transistors and/or methods of forming the same.

2. Description of Related Art

Semiconductor devices have been used in various electronic industries because of small size, multi-function and/or low manufacture cost thereof. The semiconductor devices may include semiconductor memory devices storing data, semiconductor logic devices processing operations of logical data, and hybrid semiconductor devices having both the function of the semiconductor memory devices and the function of the semiconductor logic devices.

As the electronic industries are highly developed, the semiconductor devices are increasingly integrated. Thus, it is more and more difficult to realize semiconductor devices by occurrence of various problems such as a process margin reduction of a photolithography process defining fine patterns. Additionally, high speed semiconductor devices have been demanded with the development of the electronic industries. Thus, various researches have been conducted for satisfying the demands of high integration and/or high speed of the semiconductor devices.

SUMMARY

Example embodiments of the inventive concept may provide semiconductor devices capable of being highly integrated.

Example embodiments of the inventive concept also may provide methods of manufacturing the semiconductor devices.

In some example embodiments, a semiconductor device may comprise active patterns of pillar-shapes on a substrate and spaced apart from each other in one direction; a gate electrode extending in the one direction and overlapped with sidewalls of the active patterns; a gate insulating layer between the gate electrode and the active patterns; bit lines connected to bottom surfaces of respective active patterns; and/or capacitors connected to top surfaces of the respective active patterns. Each of the active patterns may have no p-type/n-type (PN) junctions.

In some example embodiments, each of the active patterns may have a width greater than or equal to about 5 nm and less than or equal to about 30 nm.

In some example embodiments, each of the active patterns may be fully doped with dopants of one conductivity type.

In some example embodiments, each of the active patterns may comprise a channel region corresponding to the gate electrode; a first region between the channel region and a respective bit line; and/or a second region between the channel region and a respective capacitor.

In some example embodiments, the channel region, the first region, and the second region may be doped with dopants of a same conductivity type.

In some example embodiments, a method of manufacturing a semiconductor device may comprise forming active patterns of pillar-shapes upward protruding from a substrate, the active patterns fully doped with dopants of one conductivity type; forming a gate electrode extending in one direction, the gate electrode overlapped with sidewalls of the active patterns; and/or forming a gate insulating layer between the gate electrode and the active patterns.

In some example embodiments, forming the active patterns may comprise etching a substrate to form the active patterns having a width greater than or equal to about 5 nm and less than or equal to about 30 nm.

In some example embodiments, the method may further comprise, before forming the active patterns, etching a substrate to form a trench; filling a lower part of the trench with a conductive material to form a bit line; and/or filling an upper part of the trench with an insulating material to form a mask on the bit line. The gate electrode may cross over the bit line.

In some example embodiments, forming the gate insulating layer may comprise etching the substrate to form a trench extending in the one direction; and/or conformally forming the gate insulating layer on the active patterns exposed by the trench.

In some example embodiments, forming the trench may comprise forming a first part of the trench extending in the one direction; and/or forming a second part of the trench extending from the first part of the trench to at least a portion of a sidewall of a respective active pattern.

In some example embodiments, forming the gate electrode may comprise filling a part of the trench having the gate insulating layer with a conductive material to form the gate electrode; and/or forming a mask filling the trench on the gate electrode.

In some example embodiments, the method may further comprise forming capacitors on top surfaces of respective active patterns.

In some example embodiments, a semiconductor device may comprise a substrate; active patterns on the substrate that are spaced apart from each other; gate insulating layers at least partially around respective active patterns; and/or a gate electrode configured to contact the gate insulating layers. The active patterns may include no p-type/n-type (PN) junctions.

In some example embodiments, each of the active patterns may have a width greater than or equal to about 5 nm and less than or equal to about 30 nm.

In some example embodiments, each of the active patterns may be doped with dopants of a same conductivity type.

In some example embodiments, the semiconductor device may further comprise bit lines connected to bottom surfaces of the respective active patterns.

In some example embodiments, the semiconductor device may further comprise capacitors connected to top surfaces of the respective active patterns.

In some example embodiments, the semiconductor device may further comprise bit lines connected to the respective active patterns; and/or capacitors connected to the respective active patterns.

In some example embodiments, each of the active patterns may comprise a channel region corresponding to the gate electrode; a first region between the channel region and a respective bit line; and/or a second region between the channel region and a respective capacitor.

In some example embodiments, the channel region, the first region, and the second region may be doped with dopants of a same conductivity type.

In some example embodiments, a semiconductor device may comprise a substrate; active patterns on the substrate that are spaced apart from each other; a gate electrode configured to overlap sidewalls of the active patterns; and/or gate insulating layers between the gate electrode and respective active patterns. The active patterns may be doped with dopants of a same conductivity type.

In some example embodiments, each of the active patterns may have a width greater than or equal to about 5 nm and less than or equal to about 30 nm.

In some example embodiments, each of the active patterns may be fully doped with the dopants of the same conductivity type.

In some example embodiments, the semiconductor device may further comprise bit lines connected to bottom surfaces of the respective active patterns.

In some example embodiments, the semiconductor device may further comprise capacitors connected to top surfaces of the respective active patterns.

In some example embodiments, the semiconductor device may further comprise bit lines connected to the respective active patterns; and/or capacitors connected to the respective active patterns.

In some example embodiments, each of the active patterns may comprise a channel region corresponding to the gate electrode; a first region between the channel region and a respective bit line; and/or a second region between the channel region and a respective capacitor.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1A:
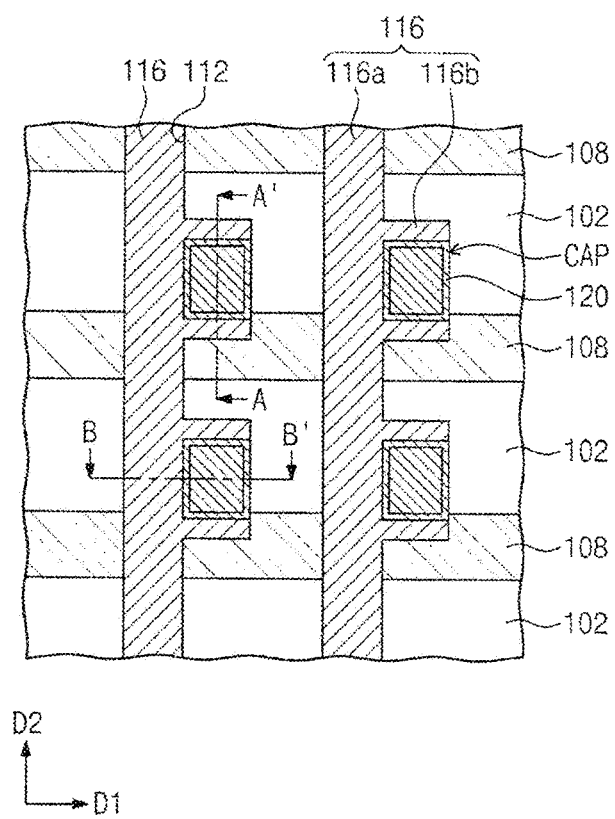
FIG. 1A is a plan view illustrating a semiconductor device according to some example embodiments of the inventive concept.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1B:
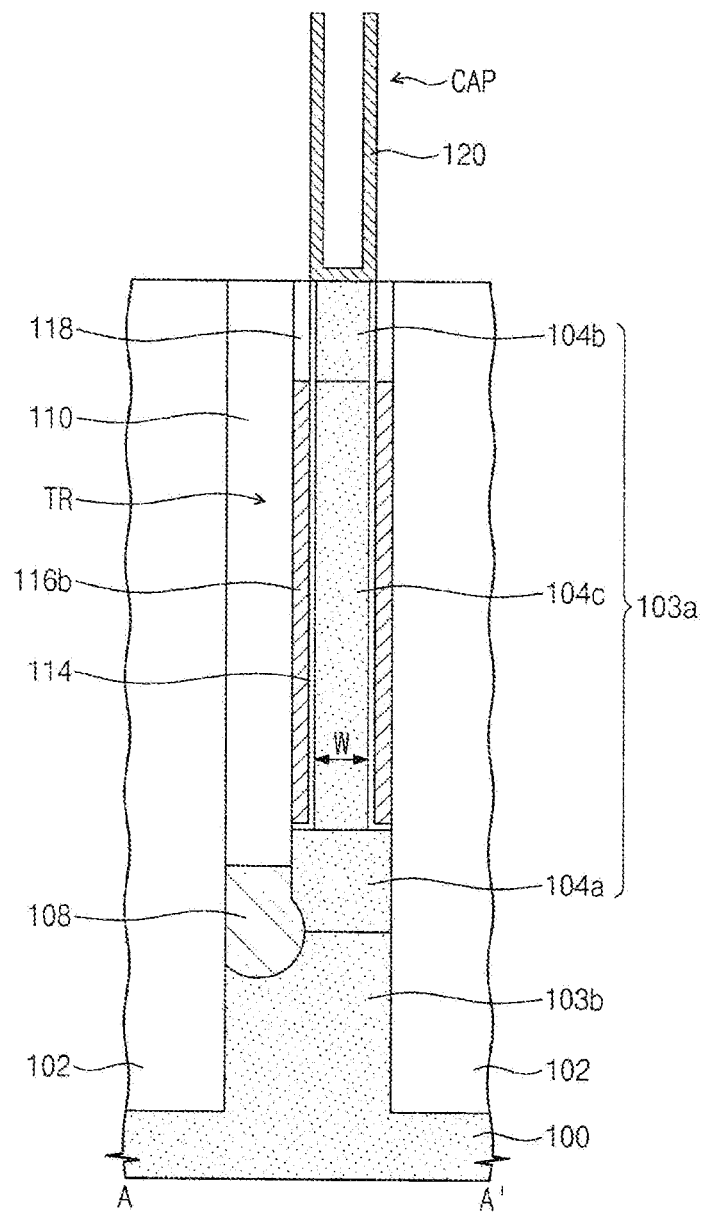
FIGS. 1B and 1C are cross-sectional views illustrating a semiconductor device according to some example embodiments of the inventive concept.

FIG. 1A is a plan view illustrating a semiconductor device according to some example embodiments of the inventive concept. FIG. 1B is a cross-sectional view taken along a line A-A' of FIG. 1A, and FIG. 1C is a cross-sectional view taken along a line B-B' of FIG. 1A.

Figure 1C:
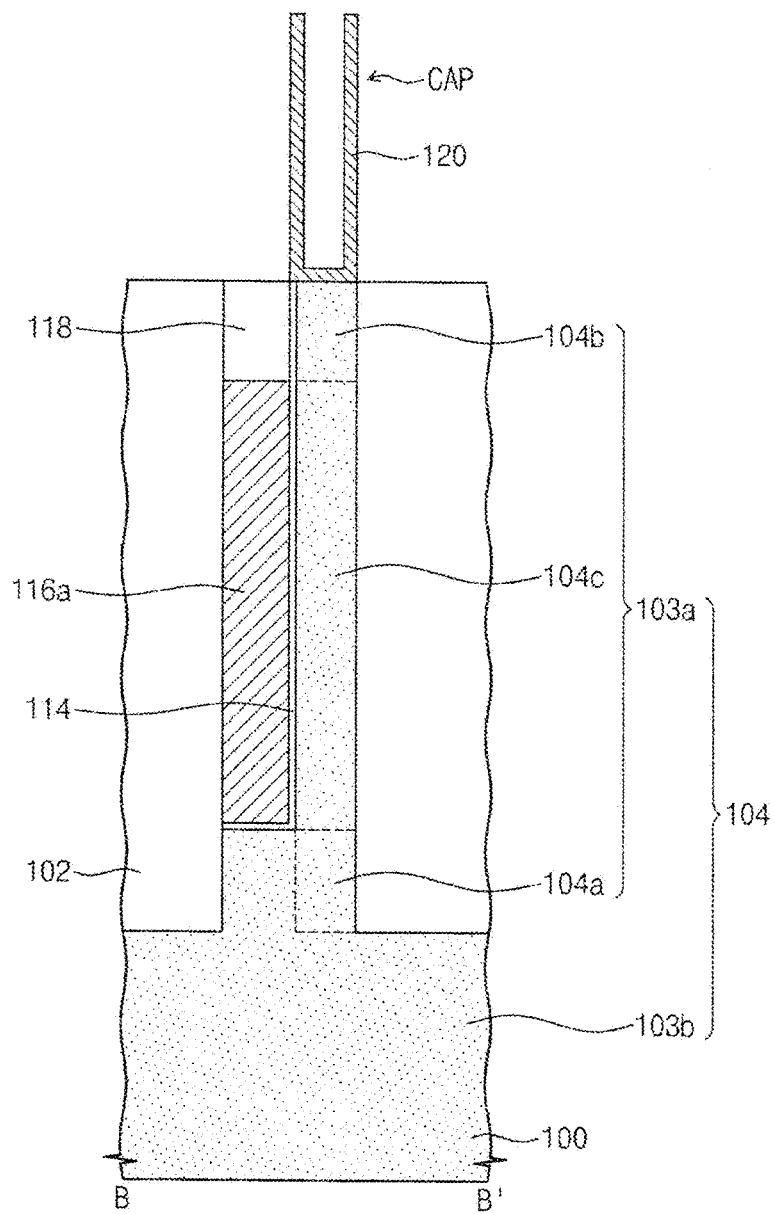

Referring to FIGS. 1A, 1B, and 1C, a semiconductor device may include a bit line 108 formed in a substrate 100, a vertical channel transistor TR, and a capacitor CAP.

The substrate 100 may include a device isolation pattern 102 and active patterns 104 defined by the device isolation pattern 102. The active patterns 104 may include lower patterns 103b extending in a first direction D1 and parallel to each other, and upper patterns 103a upward extending from the lower patterns 103b, respectively. The upper pattern 103a may have a pillar-shape. In some example embodiments, a plurality of the upper patterns 103a may be disposed on one lower pattern 103b and be spaced apart from each other the first direction D1. A plurality of the lower patterns 103b may be spaced apart from each other a second direction D2, such that the upper patterns 103a on the plurality of the lower patterns 103b may be spaced apart from each other in the first and second directions D1 and D2.

According to some example embodiments of the inventive concept, the upper pattern 103a of the active pattern 104 may have a width W within a range of several nanometers (nm) to several tens of nanometers in the first direction. The upper pattern 103a may have the width W of about 30 nm or less. The vertical channel transistor TR may have a profitable characteristic as the width W becomes smaller.

For example, if a horizontal cross section of the upper pattern 103a has a quadrangular shape, the width W may be a length of a side of the quadrangular shape parallel to the first direction D1. In some example embodiments, if the horizontal cross section of the upper patterns 103a has a circular shape, the width W may be a diameter of the circular shape.

Since the upper pattern 103a has the width W within the range of several nanometers to several tens of nanometers, a channel region in the upper pattern 103a may be fully depleted when the vertical channel transistor TR is turned off.

According to some example embodiments of the inventive concept, each of the upper patterns 103a of the active patterns 104 may be doped in whole with dopants of one conductivity type.

The bit line 108 may extend in the first direction D1 in the substrate 100. The bit line 108 is disposed under the vertical channel transistor TR, such that it may be defined as a buried bit line. The bit line 108 may include at least one of tungsten, tungsten nitride, and titanium nitride.

In some example embodiments, the semiconductor device may further include a bit line mask 110 disposed on the bit line 108. The bit line mask 110 may have substantially the same width as that of a top surface of the bit line 108, and the bit line mask 110 may extend in substantially the same direction as the extending direction of the bit line 108. The bit line mask 110 may include an insulating material such as nitride, oxide, and/or oxynitride.

The bit line 108 may be provided in plural. The plurality of bit lines 108 may be parallel to each other. According to some example embodiments of the inventive concept, the plurality of bit lines 108 may be in contact with the lower patterns 103b of the active patterns 104, respectively. The plurality of bit lines 108 may be parallel with the lower patterns 103b.

The vertical channel transistor TR may include a gate electrode 116, a gate insulating layer 114, and a channel region 104c.

The gate electrode 116 may be disposed to be adjacent to the upper patterns 103a of the active patterns 104. In some example embodiments, the gate electrode 116 may connect the upper patterns 103a of the active patterns 104 which are arranged in the second direction D2 to constitute one column. The gate electrode 116 may include at least one of tungsten, tungsten nitride, and titanium nitride.

In some example embodiments, the gate electrode 116 may include a first portion 116a extending in the second direction D2, and second portions 116b extending from the first portion 116a in the first direction D1. Each of the second portions 116b of the gate electrode 116 may surround at least a portion of each of the upper patterns 103a constituting the one column. The first portion 116a may be spaced apart from the bit line 108 and cross over the bit line 108. The first portion 116a may be disposed to be parallel to the one column at a side of the upper patterns 103a constituting the one column. The second portion 116b may be spaced apart from the capacitor CAP.

In some example embodiments, the gate electrode 116 and the bit line 108 may be spaced apart from each other by a first region 104a of the upper pattern 103a of the active pattern 104. The gate electrode 116 and the capacitor CAP may be spaced apart from each other by a second region 104b of the upper pattern 103a of the active pattern 104. The channel region 104c of the vertical channel transistor TR may be disposed between the first and second regions 104a and 104b. The channel region 104c and the first and second regions 104a and 104b may include dopants of the same conductivity type. Thus, the vertical channel transistor TR has no p-type/n-type (PN) junction. In other words, the vertical channel transistor TR may be a junctionless transistor.

According to some example embodiments of the inventive concept, the vertical channel transistor TR may include a gate mask 118 disposed on the gate electrode 116. The gate mask 118 may surround at least a portion of the second region 104b of the upper pattern 103a of the active pattern 104. The gate mask 118 may include an insulating material such as nitride, oxide, and/or oxynitride. Meanwhile, the gate electrode 116 and the gate mask 118 may be in contact with at least a portion of the bit line mask 110.

The gate insulating layer 114 may be disposed between the gate electrode 116 and the upper pattern 103a of the active pattern 104. Additionally, the gate insulating layer 114 may extend between the gate mask 118 and the upper pattern 103a of the active pattern 104. The gate insulating layer 114 may include silicon oxide and/or a high-k dielectric oxide.

The capacitor CAP may be disposed on the second region 104b of the upper pattern 103a of the active pattern 104. The capacitor CAP may be in contact with the second region 104b. The capacitor CAP may be provided in plural, and the plurality of capacitors CAP may be connected to top surfaces of the upper patterns 103a, respectively. The capacitor CAP may include a lower electrode 120, a dielectric layer (not shown), and an upper electrode (not shown). In some example embodiments, the lower electrode 120 may have a cylindrical shape. However, example embodiments of the inventive concept are not limited thereto.

As described above, the vertical channel transistor TR does not have junctions between the channel region 104c and the first and second regions 104a and 104b. In other words, the vertical channel transistor TR may be the junctionless transistor. Thus, a gate induced drain leakage (GIDL) may be reduced to suppress a floating body phenomenon of the channel region 104c. Additionally, the channel region 104c of the vertical channel transistor TR may have the width W of about 30 nm or less, so that the channel region 104c may be easily fully depleted to reduce a voltage applied to the gate electrode 116.

Hereinafter, a method of manufacturing a semiconductor device will be described.

FIGS. 2A, 3A, 4A, and 5A are plan views illustrating a method of manufacturing a semiconductor device according to some example embodiments of the inventive concept. FIGS. 2B, 3B, 4B, and 5B are cross-sectional views illustrating a method of manufacturing a semiconductor device according to some example embodiments of the inventive concept. FIGS. 2C, 3C, 4C, and 5C are cross-sectional views a method of manufacturing a semiconductor device according to some example embodiments of the inventive concept. FIGS. 2B and 2C are cross-sectional views taken along a line A-A' and a line B-B' of FIG. 2A, respectively. FIGS. 3B and 3C are cross-sectional views taken along a line A-A' and a line B-B' of FIG. 3A, respectively. FIGS. 4B and 4C are cross-sectional views taken along a line A-A' and a line B-B' of FIG. 4A, respectively. FIGS. 5B and 5C are cross-sectional views taken along a line A-A' and a line B-B' of FIG. 5A, respectively.

Figure 2A:
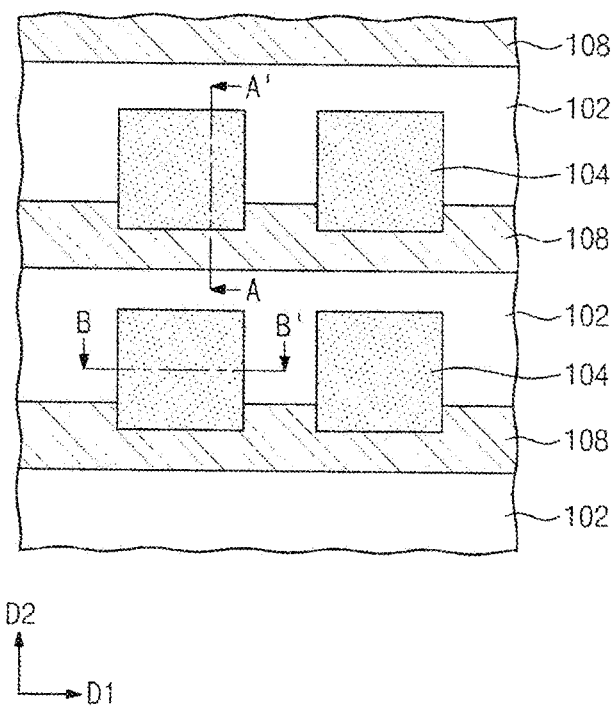
FIGS. 2A, 3A, 4A, and 5A are plan views illustrating a method of manufacturing a semiconductor device according to some example embodiments of the inventive concept.
Figure 2B:
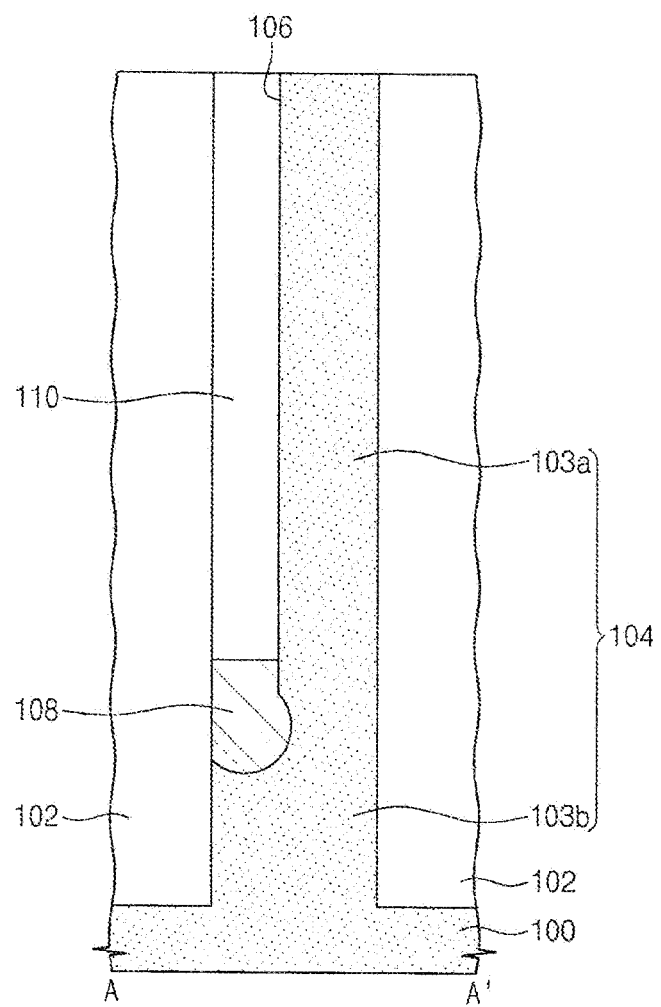
FIGS. 2B, 3B, 4B, and 5B are cross-sectional views illustrating a method of manufacturing a semiconductor device according to some example embodiments of the inventive concept.
Figure 2C:
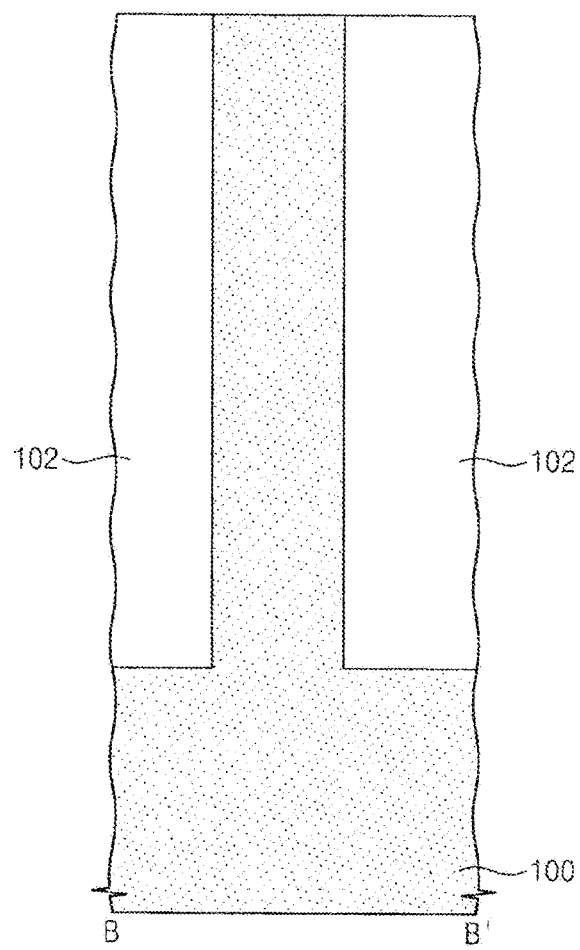
FIGS. 2C, 3C, 4C, and 5C are cross-sectional views a method of manufacturing a semiconductor device according to some example embodiments of the inventive concept.

Referring to FIGS. 2A, 2B, and 2C, a bit line 108 and a device isolation pattern 102 may be formed in a substrate 100.

The substrate 100 may be etched to form a first trench 106 extending in a first direction D1. The first trench 106 may be provided in plural. The plurality of the first trenches 106 may be parallel to each other. The plurality of the first trenches 106 may be spaced apart from each other in a second direction D2 perpendicular to the first direction D1.

A lower part of the first trench 106 may be filled with a conductive material, thereby forming a bit line 108. An upper part of the first trench 106 may be filled with an insulating material, thereby forming a bit line mask 110 on the bit line 108.

The substrate 100 may be etched to form an active pattern 104 including a lower pattern 103b and an upper pattern 103a. The lower pattern 103b may extend in the first direction D1, and the upper pattern 103a may have a pillar-shape upward protruding from the lower pattern 103b. A plurality of the upper patterns 103a may be formed on a single lower pattern 103b. The upper patterns 103a on the single lower pattern 103b may be spaced apart from each other in the first direction D1. Additionally, the lower pattern 103b may be formed in plural. In other words, the active pattern 104 may be formed in plural. The lower patterns 103b may be parallel to each other. The upper patterns 103a on the lower patterns 103b may be arranged in the first and second directions D1 and D2 and be spaced apart from each other.

In some example embodiments, an entire substrate 100 may be doped with dopants of one conductivity type. In some example embodiments, the substrate 100 may be doped with dopants of a first conductivity type, and the active pattern 104 may be doped with dopants of a second conductivity type different from the first conductivity type. The entire active pattern 104 may be doped with dopants of one conductivity type, so that the active pattern has no junction. In other words, the junctionless active pattern 104 may be formed.

Even though the junction does not exist in the active pattern 104, a vertical channel transistor TR completed in a subsequent process may function as a switching element according to a voltage applied to a gate electrode 116 thereof. Thus, the method of manufacturing the semiconductor device may not require an ion implantation process for forming conventional source/drain regions. As a result, the method of manufacturing the semiconductor device may be simple.

In some example embodiments, the upper pattern 103a of the active pattern 104 may have a width W within a range of several nanometers to several tens of nanometers. For example, the upper pattern 103a may have the width within a range of about 5 nm to about 30 nm.

The device isolation pattern 102 may be formed to fill a space between the active patterns 104. The device isolation pattern 102 may include an insulating material such as oxide, nitride, and/or oxynitride. After the device isolation pattern 102 is formed, a polishing process may be performed until top surfaces of the active patterns 104 (i.e., top surfaces of the upper patterns 103a) are exposed.

Figure 3A:
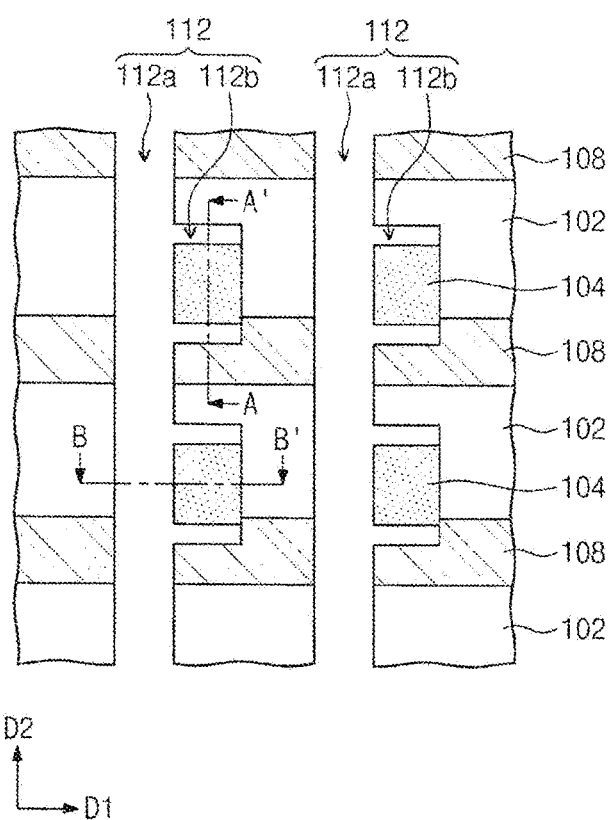
Figure 3B:
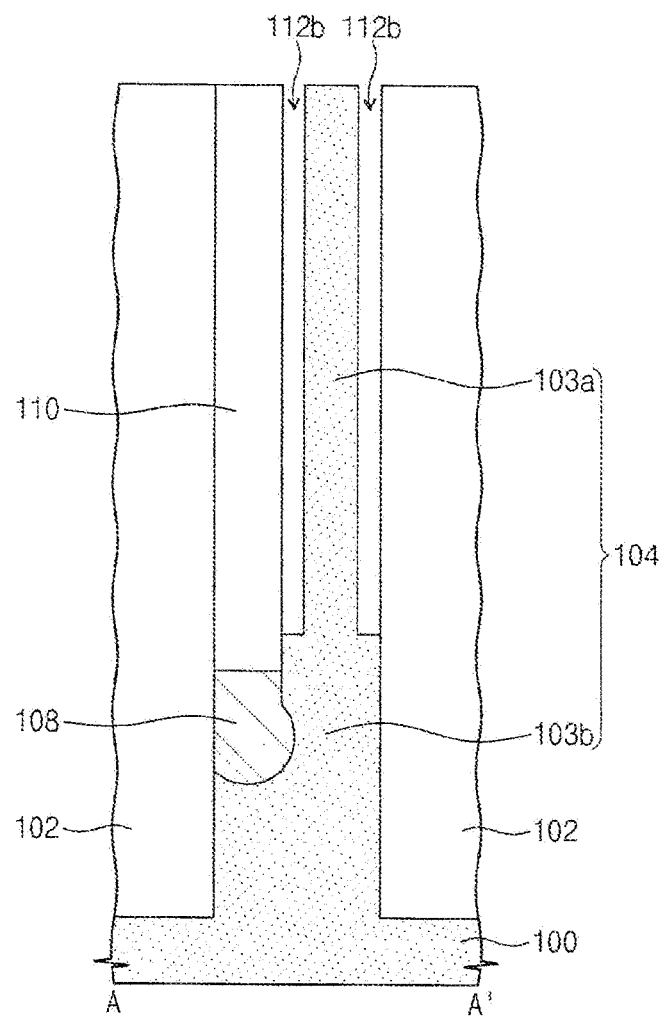
Figure 3C:
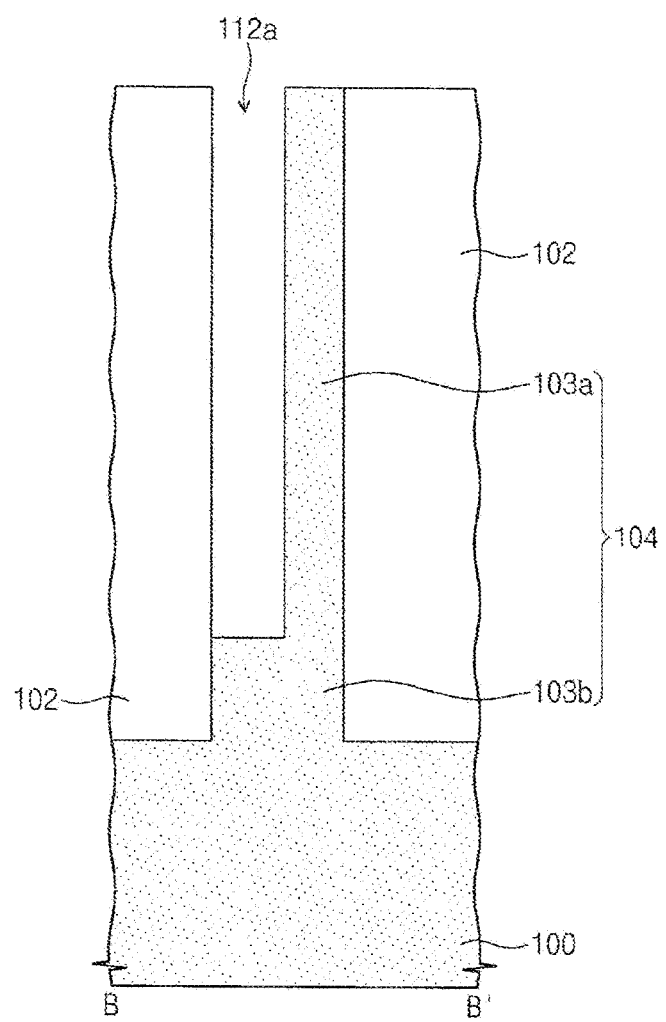

Referring to FIGS. 3A, 3B, and 3C, the bit line mask 110, the active pattern 104 and the device isolation pattern 102 may be etched to form a second trench 112.

The second trench 112 may include a first part 112a extending in the second direction D2 and a second part 112b connected to the first part 112a. The second part 112b of the second trench 112 may extend in the first direction D1 and expose at least a portion of the upper pattern 103a of the active pattern 104. A depth of the second trench 112 may be smaller than a depth of the first trench 106.

The second trench 112 may be formed in plural. The first parts 112a of the second trenches 112 may be parallel to each other and be spaced apart from each other in the first direction D1.

Figure 4A:
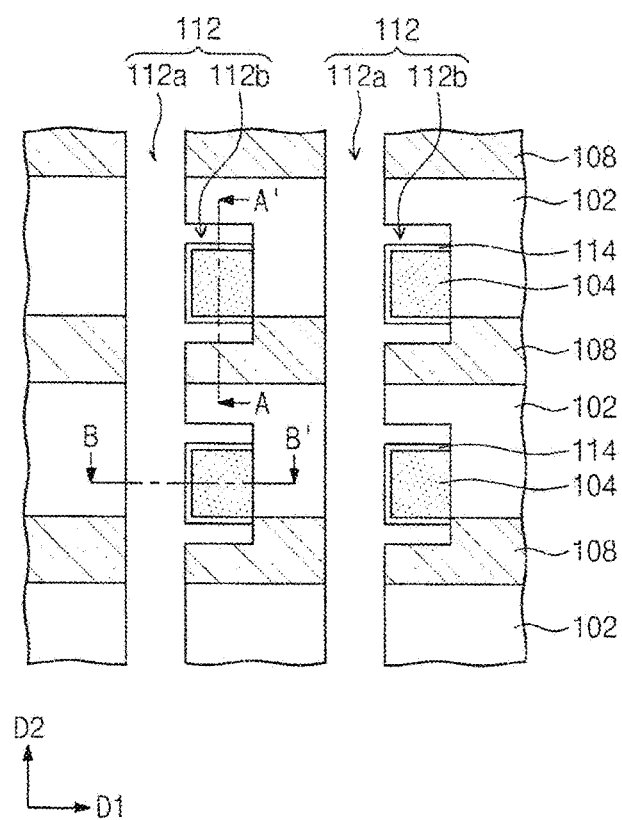
Figure 4B:
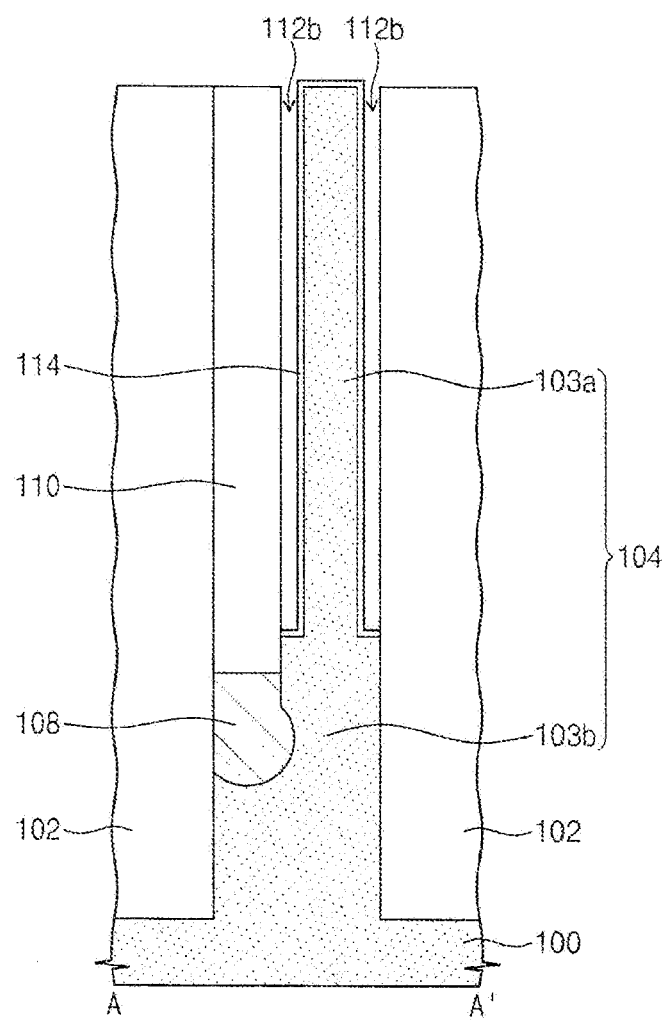
Figure 4C:
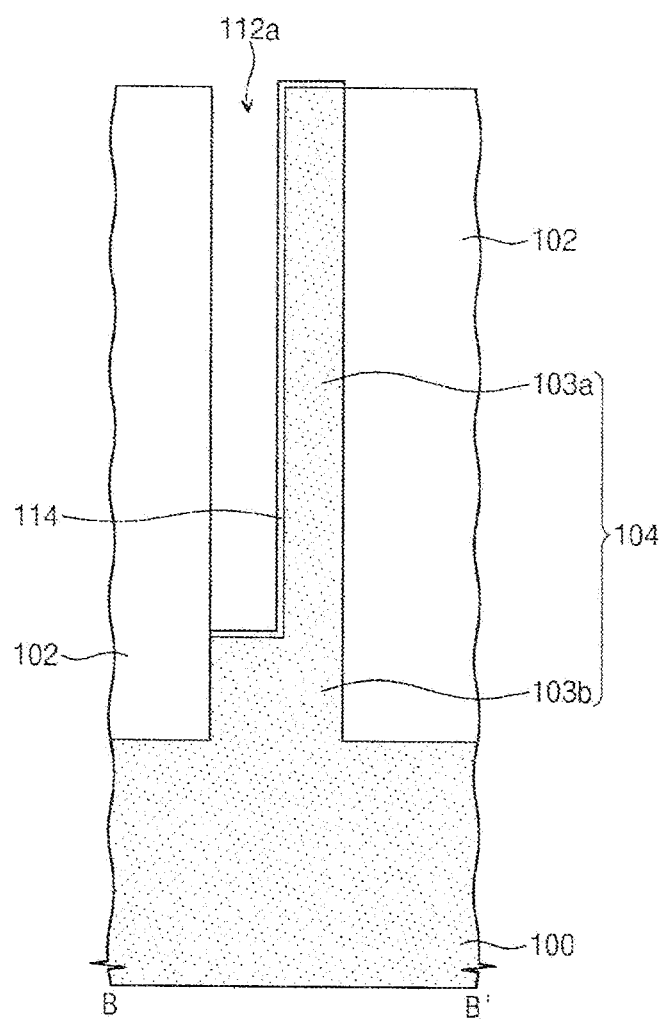

Referring to FIGS. 4A, 4B, and 4C, a gate insulating layer 114 may be formed along surfaces of the active patterns 104 exposed by the second trenches 112. The gate insulating layer 114 may not completely fill the second trenches 112.

For example, if the active patterns 104 may include silicon, the exposed active patterns 104 may be thermally oxidized to form the gate insulating layer 114 including a silicon oxide. In some example embodiments, the gate insulating layer 114 may be conformally formed along a surface profile of the exposed active patterns 104 by a deposition process.

Figure 5A:
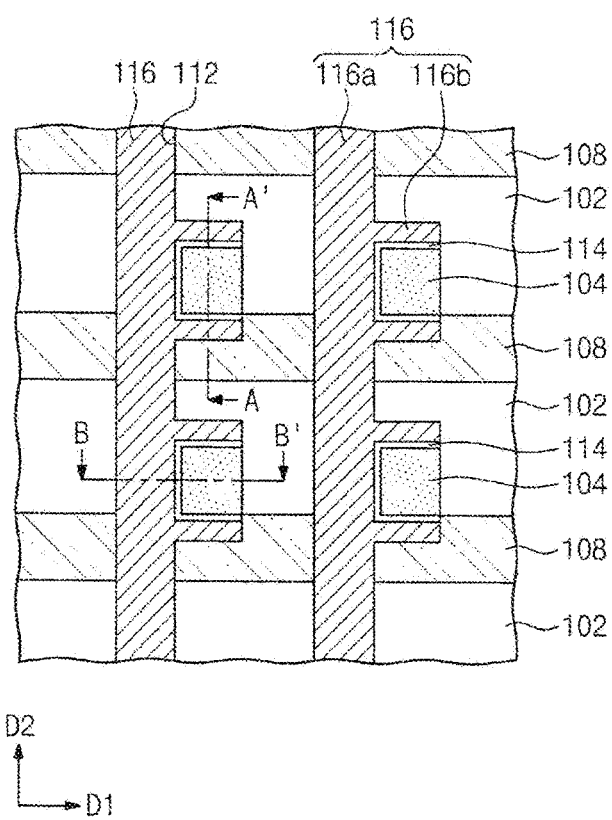
Figure 5B:
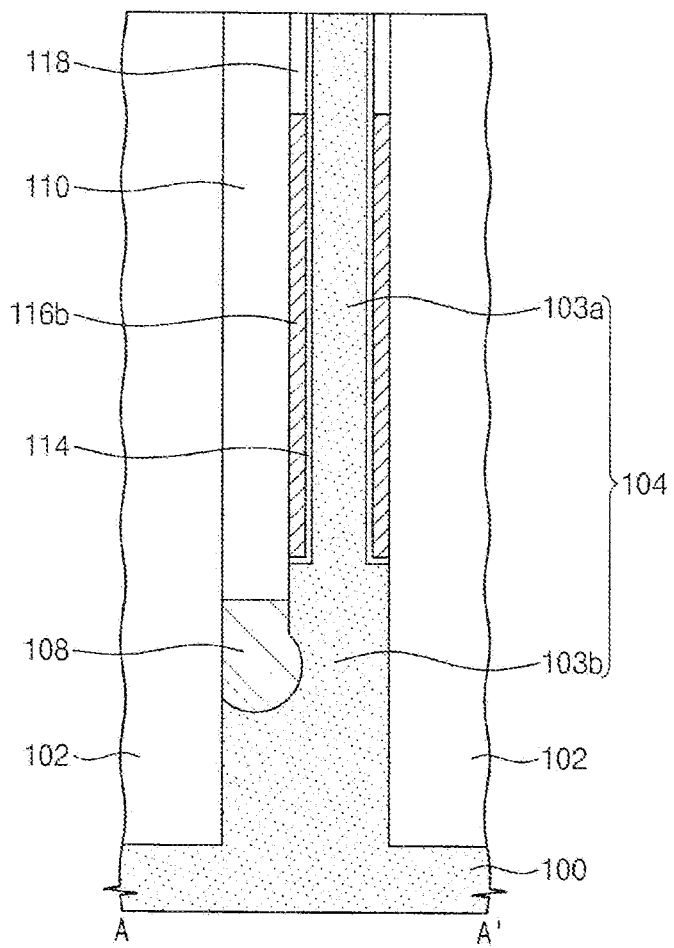
Figure 5C:
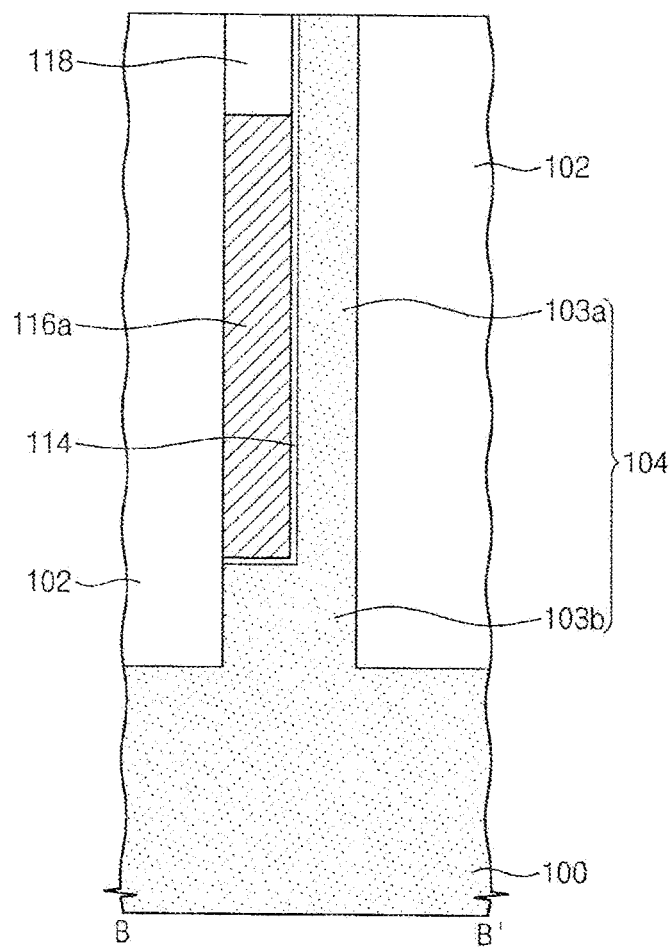

Referring to FIGS. 5A, 5B, and 5C, a gate electrode 116 and a gate mask 118 may be sequentially formed in the second trench 112 in which the gate insulating layer 114 is formed.

The gate electrode 116 may be formed by filling a part of the second trench 112 with a conductive material. The conductive material may include at least one of tungsten, titanium nitride, and tungsten nitride. The conductive material may fill a lower part of the second trench 112.

The gate electrode 116 may include a first portion 116a extending in the second direction D2 and a second portion 116b extending from the first portion 116a in the first direction D1. The second portion 116b may surround at least a portion of the upper pattern 103a of the active pattern 104.

An upper part of the second trench 112 may be filled with an insulating material, thereby forming the gate mask 118 on the gate electrode 116.

Referring to FIGS. 1A, 1B, and 1C again, the capacitor CAP may be formed on the upper pattern 103a of the active pattern 104. Even though not illustrated in detail in the drawings, after the lower electrode 120 of the capacitor CAP is formed on the upper pattern 103a of the active pattern 104, the dielectric layer and the upper electrode of the capacitor CAP may be sequentially formed on the lower electrode 120 of the capacitor CAP.

Hereinafter, a method of operating the semiconductor device according to some example embodiments will be described with reference to the drawings.

Figure 6A:
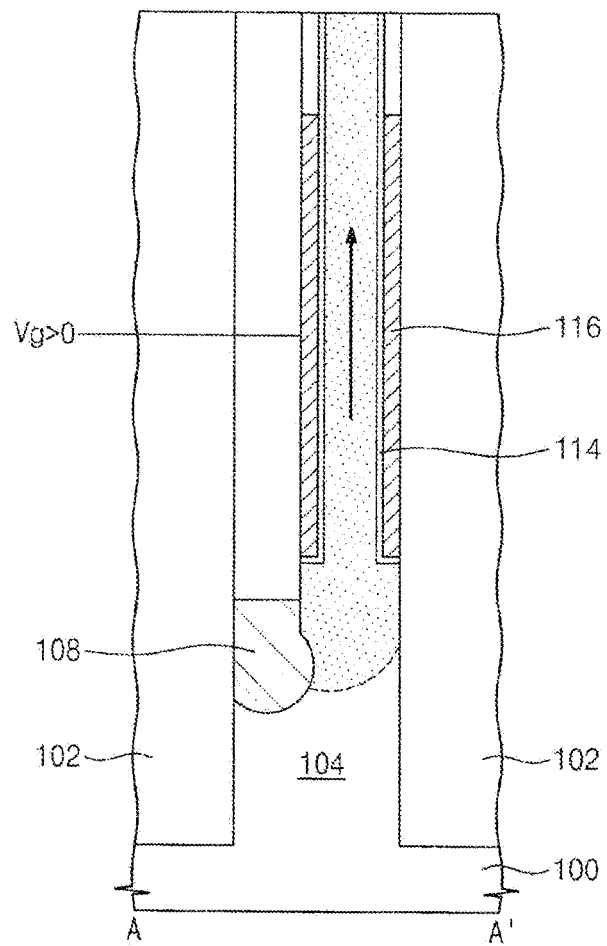
FIGS. 6A and 6B are cross-sectional views to explain a method of operating a semiconductor device according to some example embodiments of the inventive concept.
Figure 6B:
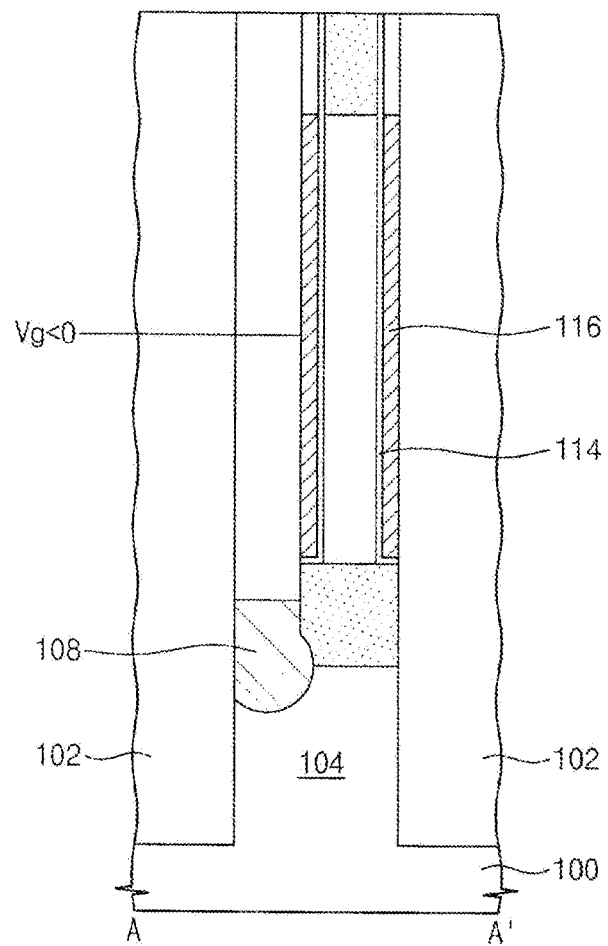

FIG. 6A is a cross-sectional view for explaining an on-operation of a transistor of the semiconductor device according to some example embodiments of the inventive concept, and FIG. 6B is a cross-sectional view for explaining an off-operation of a transistor of the semiconductor device according to some example embodiments of the inventive concept.

Referring to FIGS. 6A and 6B, the transistor of the semiconductor device may be the vertical channel transistor TR described with reference to FIG. 1B. Hereinafter, for example, the active pattern 104 of the vertical channel transistor TR may be fully doped with n-type dopants.

Referring to FIG. 6A, if a voltage Vg greater than 0 V (zero volts) is applied to the gate electrode 116 of the vertical channel transistor TR, the channel region 104c may be accumulated, so that the first region 104a is connected to the second region 104b. Thus, the vertical channel transistor TR is turned on. Since the upper pattern 103a of the active pattern 104 has the width W of several tens of nanometers, the entire channel region 104c may be accumulated. Thus, an on-current of the vertical channel transistor TR may increase, so that efficiency of the vertical channel transistor TR may increase.

Referring to FIG. 6B, if a voltage Vg less than 0 V (zero volts) is applied to the gate electrode 116 of the vertical channel transistor TR, the channel region 104c may be depleted to insulate the first region 104a from the second region 104b. Thus, the vertical channel transistor TR is turned off.

Even though not shown in detail in the drawings, if the active pattern 104 of the vertical channel transistor TR is doped with p-type dopants, the operation of the vertical channel transistor TR may be operated by methods opposite to the methods described with reference to FIGS. 6A and 6B.

Figure 7A:
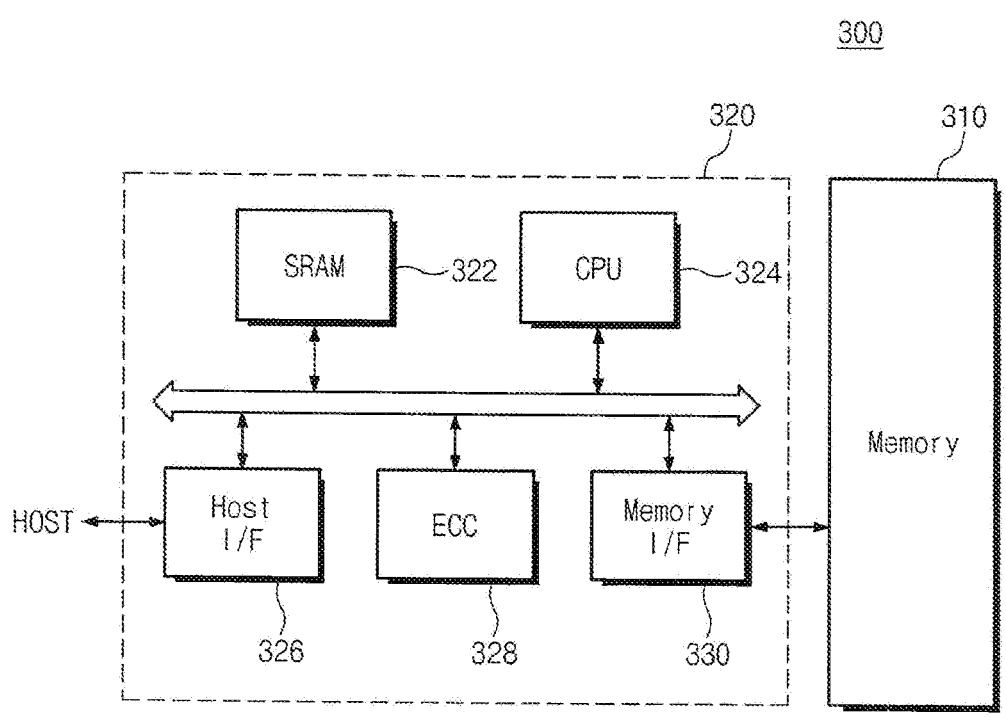
FIG. 7A is a schematic block diagram illustrating an example of memory cards including semiconductor devices according to some example embodiments of the inventive concept.

FIG. 7A is a schematic block diagram illustrating an example of memory cards including semiconductor devices according to some example embodiments of the inventive concept.

Referring to FIG. 7A, the semiconductor device according to some example embodiments of the inventive concept may be applied to a memory card 300. For example, the memory card 300 may include a memory controller 320 that controls data communication between a host HOST and a memory device 310. A static random-access memory (SRAM) device 322 may be used as an operation memory of a central processing unit (CPU) 324. A host interface (I/F) unit 326 may be configured to include a data communication protocol between the memory card 300 and the host HOST. An error check and correction (ECC) block 328 may detect and correct errors of data which are read out from the memory device 310. A memory interface (I/F) unit 330 may interface the memory device 310. The CPU 324 controls overall operations of the memory controller 320.

When the memory device 310 applied to the memory card 300 includes the semiconductor device according to some example embodiments of the inventive concept, the PN junction interface may not exist at source/drain regions. Thus, the GIDL may be reduced to suppress the floating body phenomenon of the channel region.

Figure 7B:
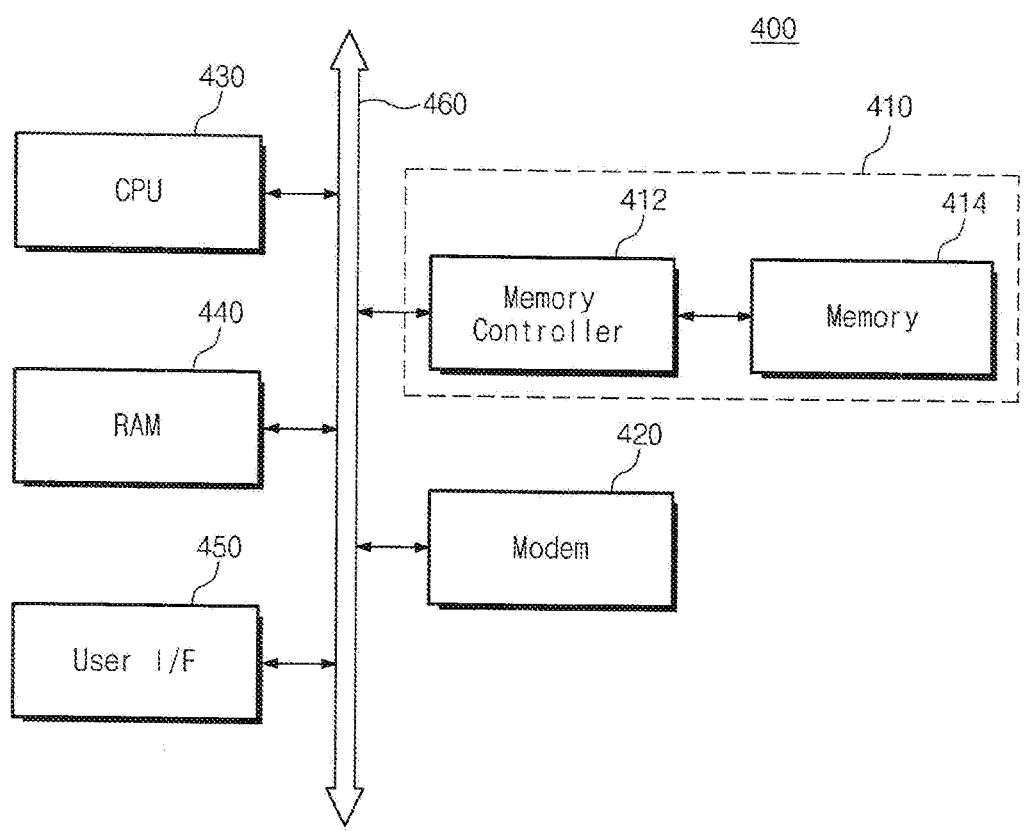
FIG. 7B is a schematic block diagram illustrating an example of systems including semiconductor devices according to some example embodiments of the inventive concept.

FIG. 7B is a schematic block diagram illustrating an example of systems including semiconductor devices according to some example embodiments of the inventive concept.

Referring to FIG. 7B, an information processing system 400 may include the semiconductor device according to some example embodiments of the inventive concept. The information processing system 400 may include a mobile device or a computer. For example, the information processing system 400 may include a modem 420, a CPU 430, a random-access memory (RAM) 440, and a user interface (I/F) unit 450 that are electrically connected to a memory system 410 through a system bus 460. The memory system 410 may store data processed by the CPU 430 or data inputted from an external device. The memory system 410 may include a memory device 414 and a memory controller 412. The memory system 410 may be substantially the same as the memory card 300 described with reference to FIG. 7A. The information processing system 400 may be realized as a memory card, a solid state disk (SSD) device, a camera image sensor and another type of application chipset. For example, the memory system 410 may consist of the SSD device. In this case, the information processing system 400 may stably and reliably store massive data.

According to some example embodiments of the inventive concept, the channel region may not be distinguished from source/drain regions, so that the vertical channel transistor has no junction. Thus, the GIDL may be reduced and the floating body phenomenon of the channel region may be prevented. As a result, performance of the vertical channel transistor may be improved.

While example embodiments have been particularly shown and described, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
    forming active patterns of pillar-shapes upward protruding from a substrate, the active patterns fully doped with dopants of one conductivity type;
    forming a gate electrode extending in one direction, the gate electrode overlapped with sidewalls of the active patterns; and
    forming a gate insulating layer between the gate electrode and the active patterns.

2. The method of claim 1, wherein forming the active patterns comprises:
    etching a substrate to form the active patterns having a width greater than or equal to about 5 nm and less than or equal to about 30 nm.

3. The method of claim 1, before forming the active patterns, further comprising:
    etching a substrate to form a trench;
    filling a lower part of the trench with a conductive material to form a bit line; and
    filling an upper part of the trench with an insulating material to form a mask on the bit line;
    wherein the gate electrode crosses over the bit line.

4. The method of claim 1, wherein forming the gate insulating layer comprises:
   etching the substrate to form a trench extending in the one direction; and
   conformally forming the gate insulating layer on the active patterns exposed by the trench.

5. The method of claim 4, wherein forming the trench comprises:
   forming a first part of the trench extending in the one direction; and
   forming a second part of the trench extending from the first part of the trench to at least a portion of a sidewall of a respective active pattern.

6. The method of claim 4, wherein forming the gate electrode comprises:
   filling a part of the trench having the gate insulating layer with a conductive material to form the gate electrode; and
   forming a mask filling the trench on the gate electrode.

7. The method of claim 1, further comprising:
   forming capacitors on top surfaces of respective active patterns.

* * * * *